United States Patent
Zheng et al.

(10) Patent No.: US 7,265,947 B2
(45) Date of Patent: Sep. 4, 2007

(54) STITCHING OF AFM AND CHANNELING LAYERS FOR IN-STACK BIASING CPP

(75) Inventors: Youfeng Zheng, San Jose, CA (US); Kochan Ju, Monte Sereno, CA (US)

(73) Assignee: Headway Technologies, Inc., Milpitas, CA (US)

( * ) Notice: Subject to any disclaimer, the term of this patent is extended or adjusted under 35 U.S.C. 154(b) by 402 days.

(21) Appl. No.: 10/980,482

(22) Filed: Nov. 3, 2004

(65) Prior Publication Data
US 2006/0092581 A1    May 4, 2006

(51) Int. Cl.
G11B 5/39    (2006.01)
(52) U.S. Cl. .................................. 360/324.12
(58) Field of Classification Search ........... 360/324.12, 360/324.2
See application file for complete search history.

(56) References Cited

U.S. PATENT DOCUMENTS

| | | | |
|---|---|---|---|
| 5,966,012 A | 10/1999 | Parkin | 324/252 |
| 6,023,395 A | 2/2000 | Dill et al. | 360/113 |
| 6,466,419 B1 | 10/2002 | Mao | 360/324.12 |
| 6,473,279 B2* | 10/2002 | Smith et al. | 360/324.12 |
| 2002/0131215 A1 | 9/2002 | Beach | 360/324.2 |
| 2002/0159201 A1* | 10/2002 | Li et al. | 360/324.1 |
| 2002/0167768 A1* | 11/2002 | Fontana et al. | 360/324.2 |
| 2003/0143431 A1* | 7/2003 | Hasegawa | 428/692 |
| 2003/0179513 A1* | 9/2003 | Pinarbasi | 360/324.11 |
| 2003/0193760 A1* | 10/2003 | Sakaguci et al. | 360/324.11 |
| 2004/0080875 A1* | 4/2004 | Pinarbasi | 360/324.2 |
| 2004/0086751 A1* | 5/2004 | Hasegawa et al. | 428/692 |
| 2004/0095690 A1* | 5/2004 | Beach | 360/324.1 |
| 2005/0030675 A1* | 2/2005 | Gill | 360/324.11 |
| 2005/0068683 A1* | 3/2005 | Gill | 360/314 |
| 2005/0157436 A1* | 7/2005 | Gill | 360/324.12 |
| 2005/0207073 A1* | 9/2005 | Carey et al. | 360/324.12 |
| 2005/0219773 A1* | 10/2005 | Li et al. | 360/324.12 |
| 2005/0243478 A1* | 11/2005 | Pinarbasi | 360/324.11 |
| 2006/0002042 A1* | 1/2006 | Gill | 360/324.12 |
| 2006/0044708 A1* | 3/2006 | Gill | 360/324.12 |

OTHER PUBLICATIONS

Derwent Document 2006-705742; IBM; Priority Data 2003RD-0466093; Feb. 10, 2003; "CPP sensor, has ferromagnetic bias layer having both shape anisotropy and length larger than sensor trackwidth on bottom of sensor stack, and ferromagnetic layer antiferromagnetically coupled to bias layer".*
Co-pending U.S. Patent App. No. HTIRC-02-004, U.S. Appl. No. 10/406,119, filed Apr. 3, 2003, "Method of Increasing CPP GMR in a Spin Valve Structure".

* cited by examiner

Primary Examiner—Jefferson Evans
(74) Attorney, Agent, or Firm—Saile Ackerman LLC; Stephen B. Ackerman

(57) ABSTRACT

The series resistance of a CPP read head having in-stack biasing has been reduced by stitching the AFM layer through a high conductance layer. Both the AFM and high conductance layers have significantly larger cross-sectional areas than the high conductance layer of prior art structures so the contribution, to the total resistance of the device, from the AFM layer as well as from spreading resistance at the stack-lead interface, is significantly reduced. The high conductance layer provides sufficient ferromagnetic coupling to enable the AFM to stabilize the in-stack bias layer. A process to manufacture the device is also described.

30 Claims, 2 Drawing Sheets

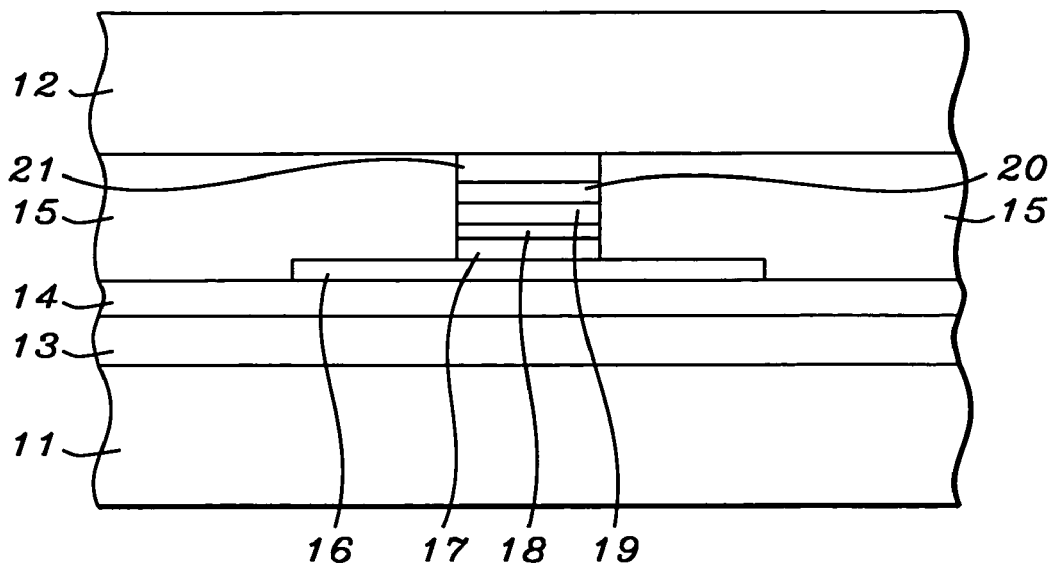
FIG. 1 – Prior Art
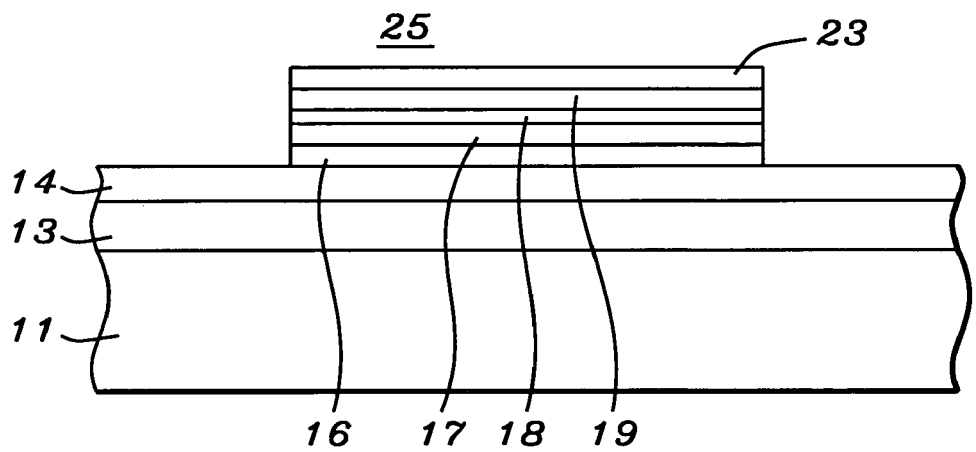
FIG. 2
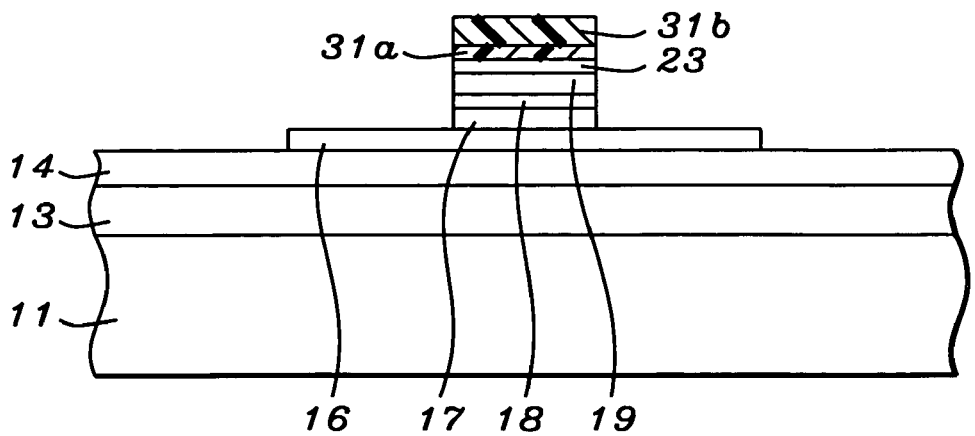
FIG. 3

STITCHING OF AFM AND CHANNELING LAYERS FOR IN-STACK BIASING CPP

RELATED PATENT APPLICATION

This application is related to, filing date Apr. 3, 2003, Ser. No. 10/406,119, assigned to a common assignee.

FIELD OF THE INVENTION

The invention relates to the general field of GMR CPP read heads with particular reference to in-stack biasing and device resistance.

BACKGROUND OF THE INVENTION

The principle governing the operation of most current magnetic read heads is the change of resistivity of certain materials in the presence of a magnetic field (magneto-resistance). Magneto-resistance can be significantly increased by means of a structure known as a spin valve or SV. The resulting increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are a low coercivity (free) ferromagnetic layer, a non-magnetic spacer layer, and a high coercivity ferromagnetic layer. The latter is usually formed out of a soft ferromagnetic layer that is pinned magnetically by a nearby layer of antiferromagnetic material (AFM). Additionally, a synthetic antiferromagnet (formed by sandwiching an antiferromagnetic coupling layer between two antiparallel ferromagnetic layers) may be used as the pinned layer. This results in an increase in the size of the pinning field so that a more stable pinned layer is obtained.

When the free layer is exposed to an external magnetic field, the direction of its magnetization is free to rotate according to the direction of the external field. After the external field is removed, the magnetization of the free layer will stay at a direction, which is dictated by the minimum energy state, determined by the crystalline and shape anisotropy, current field, coupling field and demagnetization field. If the direction of the pinned field is parallel to the free layer, electrons passing between the free and pinned layers, suffer less scattering. Thus, the resistance in this state is lower. If, however, the magnetization of the pinned layer is anti-parallel to that of the free layer, electrons moving from one layer into the other will suffer more scattering so the resistance of the structure will increase. The change in resistance of a spin valve is typically 8-20%.

Early GMR devices were designed to measure the resistance of the free layer for current flowing parallel to the film's plane. More recently, devices that measure current flowing perpendicular to the plane (CPP) have replaced them. For devices depending on in-plane current, the signal strength is diluted by parallel currents flowing through the other layers of the GMR stack, so these layers should have resistivities as high as possible while the resistance of the leads into and out of the device need not be particularly low. In contrast, in a CPP device, the resistance of the leads and of the other GMR stack layers dominate and must be as low as possible.

Although the layers enumerated above are all that is needed to produce the GMR effect, additional problems remain. In particular, there are certain noise effects associated with such a structure. Magnetization in a layer can be irregular because of reversible breaking of magnetic domain walls, leading to the phenomenon of Barkhausen noise. The solution to this problem has been to provide a device structure conducive to ensuring that the free layer is a single domain and to ensure that the domain configuration remains unperturbed after processing and fabrication steps and under normal operation. For CIP devices this is usually accomplished by giving the structure a permanent longitudinal bias provided by two opposing permanent magnets located at the sides of the device.

As track widths grow very small (<0.2 microns), the above biasing configuration has been found to no longer be suitable since the strong magnetostatic coupling at the track edges also pins the free layer which drastically reduces the SV sensitivity. The solution to this problem that has been adopted by the prior art is illustrated in FIG. 1. Shown there is a magnetic read head whose bottom lead is also bottom magnetic shield 11 on which have been deposited pinning layer 13 and pinned layer 14. As noted earlier, the latter is typically a trilayer of two magnetically antiparallel ferromagnetic layers separated by a layer of an antiferromagnetic coupling material such as ruthenium.

Non-magnetic layer 16, which is usually copper, has been given the shape of a pedestal or disc over whose center the GMR stack has been formed. The latter consists of free layer 17 which has been given its stabilizing bias by bias ferromagnetic layer (BFL) 19. It is important that this stabilizing bias be provided by a magnetostatic field and not by exchange coupling so thin non-magnetic decoupling layer 18 has been inserted between layers 17 and 19. The magnetization of BFL 19 is stabilized by being contacted by a second pinning layer, antiferromagnetic layer 20 while layer 15 is insulating material to provide internal support for the structure.

Layer 21 is a high conductance layer that provides electrical connection to top magnetic shield 12 that also serves as the top lead. To simplify manufacturing the structure seen in FIG. 1, conductive layer 21 is given the same shape and area as the remainder of the GMR stack. Since the top lead/shield 12 is made of relatively high electrical resistivity material, there is a significant spreading resistance, associated with the passage of current from layer 21 into layer 12, which contributes to the overall series resistance of the CPP unit. An another significant contribution to the series resistance comes from layer 20 because of its relatively high resistivity and small cross-sectional area.

The following reference of interest was found during a routine search of the prior art: Frederick Hayes Dill et al, U.S. Pat. No. 6,023,395 2000.

SUMMARY OF THE INVENTION

It has been an object of at least one embodiment of the present invention to provide a CPP read head with in-stack biasing.

Another object of at least one embodiment of the present invention has been that said read head have lower through-stack resistance than equivalent structures of the prior art.

Still another object of at least one embodiment of the present invention has been that said reduced resistance be achieved without any loss of effectiveness for said in-stack biasing.

A further object of at least one embodiment of the present invention has been to provide a process for manufacturing said read head.

These objects have been achieved by stitching the AFM layer, used to pin the bias layer, through a high conductance layer. Since both the AFM and high conductance layers have significantly larger cross-sectional areas than the high conductance layer used in prior art structures, the series contribution, to the total resistance of the device, from the AFM layer as well as from spreading resistance at the stack-lead interface, is significantly reduced. The high conductance layer provides sufficient ferromagnetic coupling to enable the AFM to stabilize the in-stack bias layer.

A process to manufacture the above structure is also described. A liftoff mask is used to both create the GMR stack through subtractive etching as well as to remove insulation from above the stack after it has been applied to provide a supporting layer for the high conductance and subsequent layers. Experimental data confirming the efficacy of the device is also presented.

BRIEF DESCRIPTION OF THE DRAWINGS

FIG. 1 shows a CPP read head, with in-stack biasing, of the prior art.

FIG. 2 illustrates the starting point of the process of the present invention.

FIG. 3 shows the formation of the GMR stack during the process of the present invention.

DESCRIPTION OF THE PREFERRED EMBODIMENTS

Figure 4:
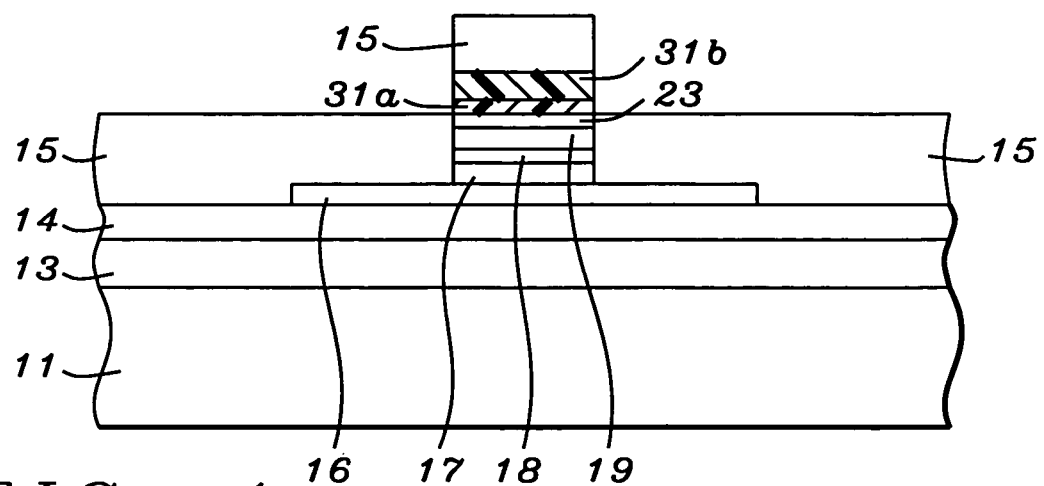
FIGS. 4 and 5 illustrate the partial encapsulation of said GMR stack.

The present invention will be disclosed through a description of the process for its manufacture. Said description will also make clear the structure of the present invention.

Referring now to FIG. 2, the process for manufacturing the present invention begins with the provision of a substrate (not shown) onto which is deposited lower magnetic shield 11 which will also serve as a lower electrical lead for the device. Then, in succession are deposited pinning layer 13, pinned layer 14, non-magnetic layer 16, free layer 17, decoupling layer 18, biasing ferromagnetic layer (BFL) 19, and capping layer 23. The latter is for protecting the GMR stack during subsequent processing steps. Most of it will later be removed but, as will be seen shortly, part of this capping layer may remain, so it needs to be a material having relatively low resistivity and must also be able to provide ferromagnetic coupling. Materials suitable for the capping layer include Ru and Au and it is deposited to a thickness between about 20 and 60 Angstroms.

The next step is to pattern layers 16-19 and 23 down to the level of pinned layer 14 thereby forming pedestal 25. An etch mask that defines the GMR stack is then formed on the top surface of pedestal 25. As seen in FIG. 3, this etch mask is made up of two layers; layer 31a is a photosensitive material that is readily etched while layer 31b is photoresist. Mask 31a/b is used twice. Its first application is for the subtractive etching of layers 17-19 and 23 to form GMR stack 35, with non-magnetic layer 16 serving as an etch stop layer. Because layer 31a is readily etched by isotropically acting etchants, an anisotropic etching process that favors removal of material along a direction normal to the surface must be used here. Examples of suitable etch processes include (but are not limited to) reactive ion etching (RIE) and ion beam etching (IBE).

Referring next to FIG. 4, with mask 31a/b still in place, a layer of insulating material 15 is then deposited over the structure. Its thickness is such that its top surface ends up being coplanar with the stack's top surface, care being taken to ensure that at least some of layer 31a remains exposed.

Figure 5:
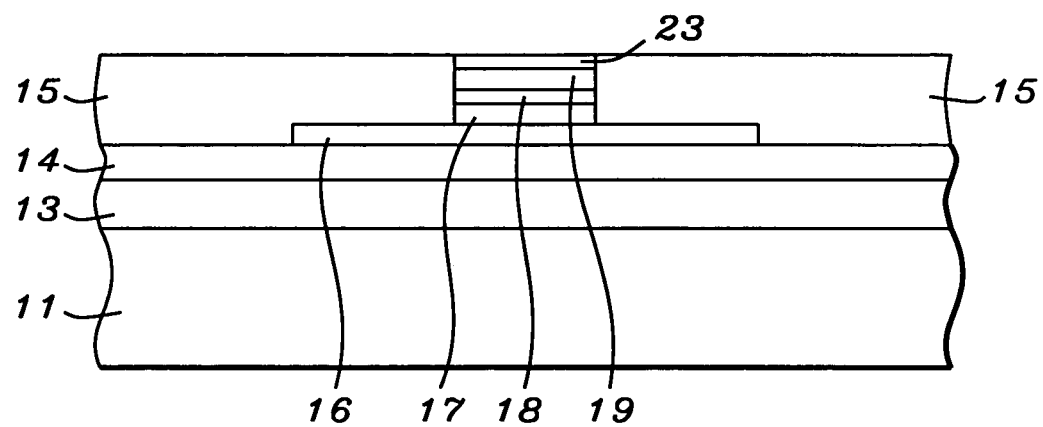

Layer 31a is then selectively etched away, causing the entire mask 31a/b mask to lift off, together with any of insulating material 15 that has been deposited on to it, resulting in the exposure of capping layer 23 as illustrated in FIG. 5.

Figure 6:
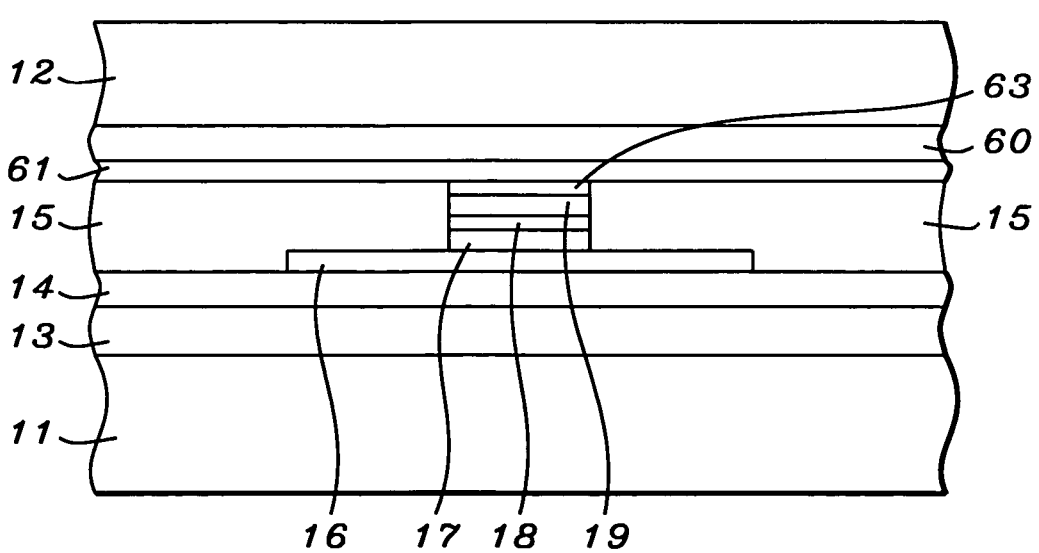
FIG. 6 shows the completed structure that constitutes the present invention.

Most of capping layer 23 is then etched away, the etching endpoint being determined by the appearance of some part of the surface of BFL 19. Then, as a key feature of the invention, high conductance layer 61, antiferromagnetic layer 60 (TiMn or PtMn, for example), deposited to a thickness between about 50 and 200 Angstroms), and upper magnetic shield layer 12 are deposited in succession as seen in FIG. 6, the area and placement of these last three layers being similar to that of the lower layers 11, 13, and 24. Since the areas of AFM layer 60 and of conducting layer 61 are now between about 2 and 5 times the GMR stack area, the contributions due to the AFM and to spreading resistance have both been greatly reduced. Note that the remaining portions of the original layer 23 are now designated as layer 63 in FIG. 6.

Since BFL 19 is magnetically pinned through exchange with AFM 60, it is necessary for both layers 61 and 63 to be capable of ferromagnetic coupling. This is readily accomplished if these layers are themselves ferromagnetic, in which case the thickness of layer 61 can be in the range of from about 20 to 100 Angstroms (Ni for example). It is also possible for layer 61 to be non-magnetic since most paramagnetic materials can provide ferromagnetic coupling if they are not too thick. Suitable materials here include (but are not limited to) Cu and Ru, in which case the thickness of layer 61 may not exceed about 20 Angstroms.

Results

In TABLE I below, we compare CPP resistances for a regular in-stack structure (such as shown in FIG. 1) and a structure of the present invention, both normalized relative a simple GMR stack with no in-stack bias. 'AP' refers to the two anti-parallel layers of the pinned layer, CCL is the high conductance layer, all thicknesses are in Angstroms, and the track width in all cases was 0.05 microns:

TABLE I

| | CONFIGURATION | Normalized R |
|---|---|---|
| Ref. | AFM150/AP60/Cu30/free30 | 1 |
| Reg. in-stack | AFM150/AP60/Cu30/free30/BFL30/AFM50 | 1.83 |
| Present inv. | AFM150/AP60/Cu30/free30/BFL30/CCL/AFM50 | 1.28 |

This data confirms the effectiveness of the structure disclosed above. As can be seen, the electrical resistance through a stack of the present invention is between about 70 and 90% lower than that of a similar stack of the prior art.

What is claimed is:

1. A magnetic CPP read head, comprising:
   a GMR stack whose top layer is a bias ferromagnetic layer;
   a high conductivity layer, substantially overlapping as well as contacting said bias ferromagnetic layer, to reduce electrical resistance through said stack; and on and contacting said high conductivity layer, an antiferromagnetic layer that is magnetically coupled, through said high conductivity layer, to said bias ferromagnetic layer to provide in-stack biasing for said free layer.

2. The read head described in claim 1 wherein said high conductivity layer is ferromagnetic.

3. The read head described in claim 2 wherein said high conductivity layer has a thickness between about 20 and 100 Angstroms.

4. The read head described in claim 1 wherein said high conductivity layer is a paramagnetic material such as Cu or Ru.

5. The read head described in claim 4 wherein said high conductivity layer has a thickness between about 5 and 20 Angstroms.

6. The read head described in claim 1 wherein said high conductivity layer has a maximum width that is between about 2 and 5 times that of said GMR stack.

7. The read head described in claim 1 wherein said antiferromagnetic layer is IrMn or PtMn.

8. A magnetic read head, comprising:
a substrate on which is a lower magnetic shield layer;
a pinning layer on said lower magnetic shield layer;
a pinned layer on said pinning layer;
on said pinned layer, a non-magnetic metal layer having the form of a pedestal of lesser area than said pinned layer;
on said non-magnetic metal layer, a GMR stack of lesser area than said pedestal, said GMR stack having a top surface and comprising a free layer, on which there is a decoupling layer, on which there is a biasing ferromagnetic layer;
a layer of an insulating material on said pinned and non-magnetic layers, said layer of insulating material having a top surface that is coplanar with said stack top surface;
on said insulating and biasing ferromagnetic layers, a high conductance layer having a larger area than said GMR stack area;
on said high conductance layer, an antiferromagnetic layer that is magnetically coupled, through said high conductance layer, to said bias ferromagnetic layer; and
an upper magnetic shield layer on said antiferromagnetic layer.

9. The read head described in claim 8 wherein said high conductance layer is ferromagnetic.

10. The read head described in claim 9 wherein said high conductance layer has a thickness between about 20 and 100 Angstroms.

11. The read head described in claim 8 wherein said high conductance layer is a paramagnetic material such as Cu or Ru.

12. The read head described in claim 11 wherein said high conductance layer has a thickness between about 5 and 20 Angstroms.

13. The read head described in claim 8 wherein said high conductance layer has a maximum width that is between about 2 and 5 times that of said GMR stack.

14. The read head described in claim 8 wherein said antiferromagnetic layer is IrMn or PtMn.

15. A process to manufacture a magnetic CPP read head, comprising:
providing a GMR stack, including a free layer, whose top layer is a bias ferromagnetic layer having a first area;
depositing a high conductivity layer that contacts and fully overlaps said bias ferromagnetic layer and that has a second area larger than said first area; and
depositing on and contacting said high conductivity layer an antiferromagnetic layer that is magnetically coupled, through said high conductivity layer, to said bias ferromagnetic layer.

16. The process described in claim 15 wherein said high conductivity layer is ferromagnetic.

17. The process described in claim 16 wherein said high conductivity layer is deposited to a thickness between about 20 and 100 Angstroms.

18. The process described in claim 15 wherein said high conductivity layer is a paramagnetic material such as Cu or Ru.

19. The process described in claim 18 wherein said high conductivity layer is deposited to a thickness between about 5 and 20 Angstroms.

20. The read head described in claim 15 wherein said second area is between about 2 and 5 times said first area.

21. The read head described in claim 15 wherein said antiferromagnetic layer is IrMn or PtMn.

22. The read head described in claim 15 wherein said antiferromagnetic layer is deposited to a thickness between about 50 and 200 Angstroms.

23. A process to manufacture a magnetic read head, comprising:
providing a substrate and depositing thereon a lower magnetic shield layer;
then, with no intervening steps, depositing, in succession on said lower magnetic shield layer, a pinning layer, a pinned layer, a non-magnetic layer, a free layer, a decoupling layer, a biasing ferromagnetic layer, and a capping layer, thereby forming a stack having a top surface;
patterning and then etching said stack down to the level of said pinned layer, thereby forming a first pedestal;
forming on said first pedestal a mask, having top and bottom layers, that defines a second pedestal, having a first area, that is fully overlapped by said first pedestal;
forming said second pedestal through subtractive etching of the first pedestal down to the level of said non-magnetic layer, said non-magnetic layer serving as an etch stop layer;
with said mask still in place, depositing a layer of an insulating material having a top surface that is coplanar with said stack top surface, whereby said mask bottom layer remains exposed;
selectively etching said mask bottom layer thereby causing said mask to lift off, together with any of said insulating material that had been deposited thereon, thereby exposing said capping layer; then etching said capping layer until any part of said biasing ferromagnetic layer is exposed;
then depositing, in succession, a high conductance layer, an antiferromagnetic layer, and an upper magnetic shield layer; and
patterning said high conductance, antiferromagnetic, and upper shield layers giving them a second area that is greater than said first area.

24. The process described in claim 23 wherein said high conductance layer is ferromagnetic.

25. The process described in claim 24 wherein said high conductance layer is deposited to a thickness between about 20 and 100 Angstroms.

26. The process described in claim 23 wherein said high conductance layer is a paramagnetic material such as Cu or Ru.

27. The process described in claim 26 wherein said high conductance layer is deposited to a thickness between about 5 and 20 Angstroms.

28. The read head described in claim 23 wherein said second area is between about 2 and 5 times said first area.

29. The read head described in claim 23 wherein said antiferromagnetic layer is IrMn or PtMn.

30. The read head described in claim 23 wherein said antiferromagnetic layer is deposited to a thickness between about 50 and 200 Angstroms.

* * * * *